United States Patent [19]

Gotou et al.

[11] Patent Number: 5,225,722
[45] Date of Patent: Jul. 6, 1993

[54] SIGNAL TRANSMISSION CIRCUIT AND SIGNAL TRANSMISSION METHOD

[75] Inventors: Kouji Gotou; Kazuya Ishihara, both of Hyogo, Japan

[73] Assignee: Mitsubishi Denki Kabushiki Kaisha, Tokyo, Japan

[21] Appl. No.: 687,658

[22] Filed: Apr. 19, 1991

[30] Foreign Application Priority Data

Apr. 24, 1990 [JP] Japan ................. 2-109601

[51] Int. Cl.$^5$ .................. H03K 19/096; H03K 17/16
[52] U.S. Cl. ................... 307/475; 307/443; 307/445
[58] Field of Search ............ 307/475, 443, 445

[56] References Cited

U.S. PATENT DOCUMENTS

| | | | |
|---|---|---|---|
| 4,651,333 | 3/1987 | Cappon | 307/481 |
| 4,883,989 | 11/1989 | Mizukami | 307/481 |
| 5,030,857 | 7/1991 | Sanwo et al. | 307/481 |
| 5,093,588 | 3/1992 | Ando et al. | 307/481 |

FOREIGN PATENT DOCUMENTS

62-201862 12/1987 Japan.

Primary Examiner—Edward P. Westin
Assistant Examiner—Richard Roseen
Attorney, Agent, or Firm—Lowe, Price, LeBlanc & Becker

[57] ABSTRACT

A main bus and a plurality of sub buses constitute a hierarchical bus. A signal transmission circuit is connected between the main bus and each of the plurality of sub buses. The main bus and the plurality of sub buses are precharged to a predetermined potential. The signal transmission circuit discharges a corresponding sub bus or causes the potential of the sub bus to be maintained in accordance with the potential of the main bus when a first enable signal is at a first logic level. The signal transmission circuit causes the potential of a corresponding sub bus to be maintained when a first enable signal is at a second logic level. The signal transmission circuit discharges the main bus or causes the potential of the main bus to be maintained in accordance with the potential of a corresponding sub bus when a second enable signal is at a first logic level. The signal transmission circuit causes the potential of the main bus to be maintained when a second enable signal is at a second logic level.

16 Claims, 5 Drawing Sheets

SIGNAL TRANSMISSION CIRCUIT AND SIGNAL TRANSMISSION METHOD

BACKGROUND OF THE INVENTION

Field of the Invention

The present invention relates to signal transmission circuits, and, more particularly, relates to a signal transmission circuit and a signal transmission method for bidirectionally transmitting a signal between a first bus and a second bus.

Description of the Background Art

Figure 5:
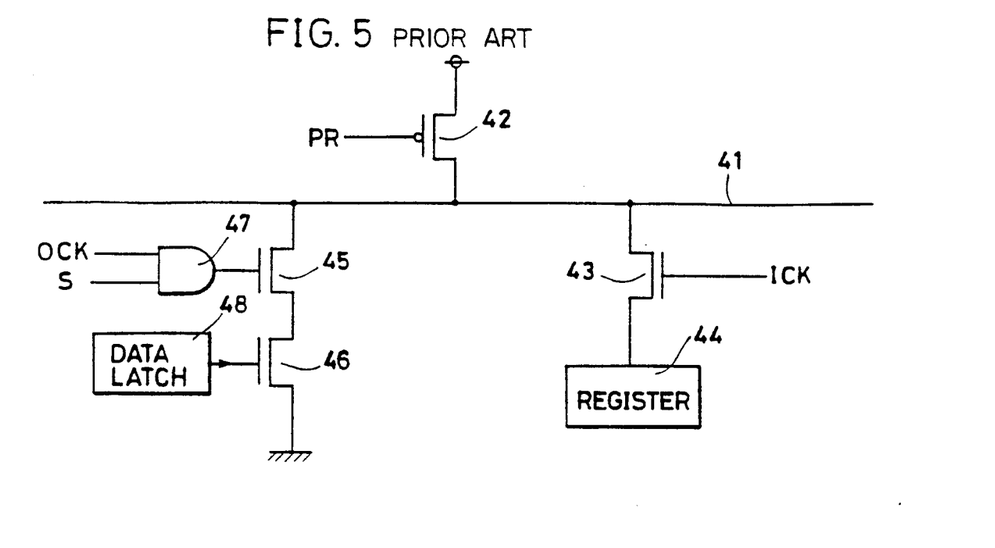
FIG. 5 is a circuit diagram showing a signal transmission circuit configuration of the conventional precharge system.

FIG. 5 is a circuit diagram schematically showing an arrangement of a signal transmission circuit of a conventional and general precharge system. This signal transmission circuit, for example, is used in a semiconductor integrated circuit device such as a microcomputer etc.

In FIG. 5, a signal transmission line (hereinafter referred to as bus) 41 is coupled to a supply potential through a P channel type MOS transistor for precharge (hereinafter referred to as precharge transistor) 42. A precharge clock signal PR is supplied to the gate of precharge transistor 42. Also, bus 41 is coupled to a ground potential through N channel type MOS transistors 45 and 46. Connected to the gate of transistor 45 is the output terminal of a 2-input AND gate 47. One input terminal of AND gate 47 is provided with an output clock signal OCK, and the other input terminal is provided with a selection signal S. The gate of transistor 46 is provided with an output signal of a data latch 48.

Moreover, a register 44 is connected to bus 41 through N channel type MOS transistor 43. An input clock signal ICK is supplied to the gate of transistor 43.

Practically, while a plurality of logic circuits such as a plurality of data latches and registers, etc. are connected to bus 41, in FIG. 5, there are shown one data latch 48 and one register 44 in order to make the description simple.

Figure 6:
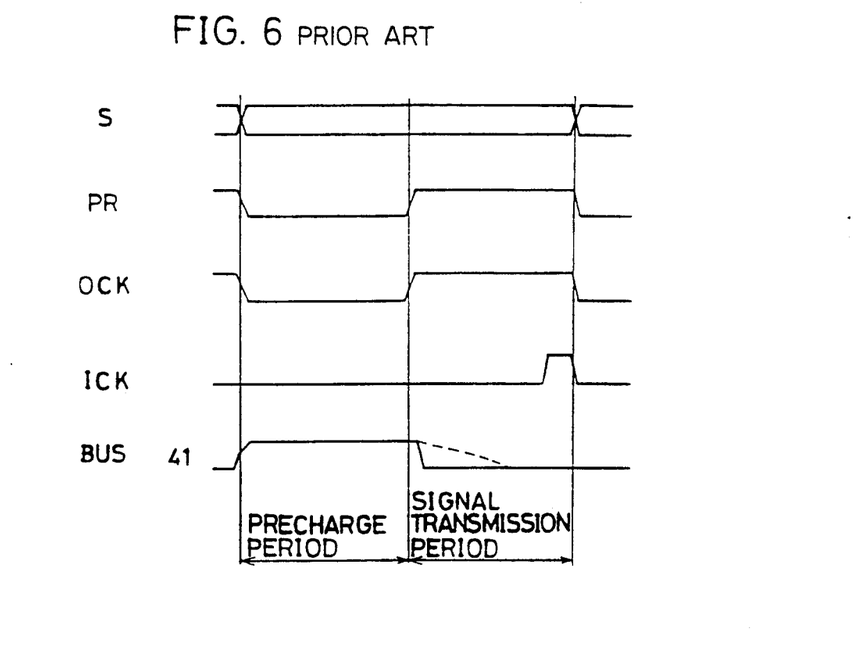
FIG. 6 is a timing chart for describing the operation of the signal transmission circuit of FIG. 5.

The operation of the signal transmission circuit in FIG. 5 will now be described with reference to the timing chart in FIG. 6.

During the precharge period, the output clock signal OCK and the input clock signal ICK attain an L level (a logically low level). Thereby, transistor 45 and transistor 43 turn off. Also, the precharge clock signal PR attains an L level. Thereby, precharge transistor 42 turns on so that bus 41 is precharged to an H level (a logically high level).

In the period of signal transmission, the precharge clock signal PR attains an H level. Precharge transistor 42, thereby, turns off so that bus 41 is electrically disconnected from the supply potential. At the same time, the output clock signal OCK attains an H level. When the selection signal S supplied to AND gate 47 is at an H level, the output of AND gate 47 attains an H level. Thereby, transistor 45 turns on. When the output signal of data latch 48 is at an H level, transistor 46 turns on. Accordingly, bus 41 is discharged so that its potential attains an L level. When the output signal of data latch 48 is at an L level, transistor 46 turns off. Therefore, the electric charge supplied to bus 41 is held, and its potential is held at an H level.

Subsequently, just before the end of the signal transmission period, the input clock signal ICK attains an H level. Transistor 43 thereby turns on so that the signal on bus 41 is applied to register 44.

Thus, the signals at an H level or an L level, supplied from data latch 48 are respectively inverted and input to register 44.

In such a conventional signal transmission circuit, if bus 41 has the larger electrical capacity and the physical length of bus 41 becomes longer, a longer time is required for discharge of bus 41 through transistors 45 and 46. In this case, as shown in a broken line in FIG. 6, as the potential change of bus 41 becomes slow, the potential becomes unstable.

It is known that, in order to solve these problems, a bus is split using a bidirectional signal transmission circuit shown in FIG. 7 (hereinafter referred to as bidirectional buffer).

Figure 7:
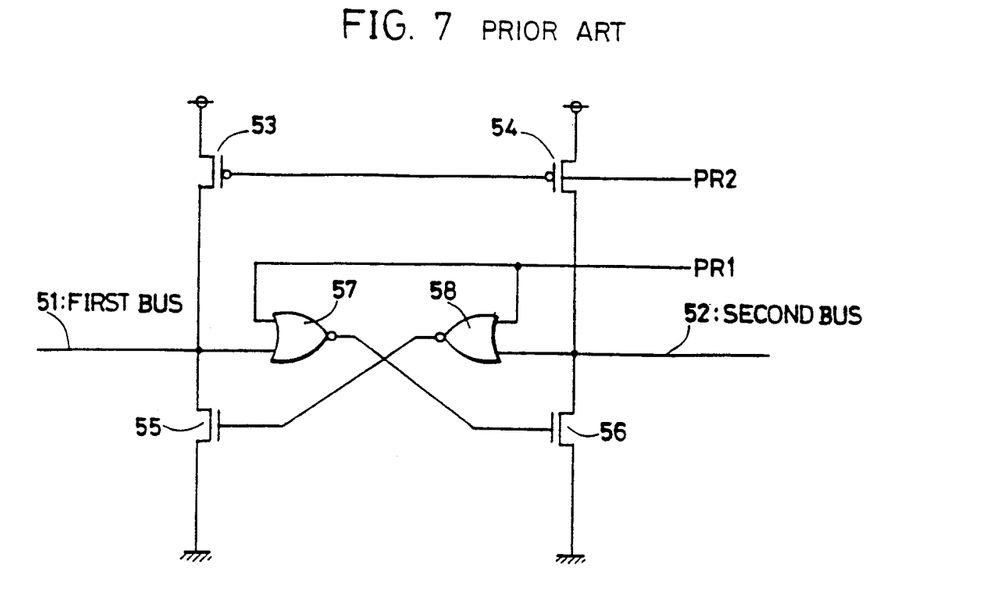
FIG. 7 is a circuit diagram showing the conventional bidirectional buffer configuration.

The bidirectional buffer shown in FIG. 7 is provided between a first signal transmission line (hereinafter referred to as first bus) 51 and a second signal transmission line (hereinafter referred to as second bus) 52. The first bus 51 is connected to one input terminal of an NOR gate 57 and the second bus 52 is connected to one input terminal of an NOR gate 58. The other input terminals of NOR gates 57 and 58 are provided with a first precharge signal PR1.

The first bus 51 is coupled to the supply potential through a first P channel type MOS transistor for precharge (hereinafter referred to as first precharge transistor) 53. Also, the first bus 51 is coupled to the ground potential through a first N channel type MOS transistor for discharge (hereinafter referred to as first discharge transistor) 55. The second bus 52 is coupled to the supply potential through a second P channel type MOS transistor for precharge (hereinafter referred to as second precharge transistor) 54. Also, the second bus 52 is coupled to the ground potential through a second N channel type MOS transistor for discharge (hereinafter referred to as second discharge transistor) 56. The output of NOR gate 57 is supplied to the gate of the second discharge transistor 56, and the output of NOR gate 58 is supplied to the gate of the first discharge transistor 55. The gates of the first and the second precharge transistors 53 and 54 are provided with a second precharge signal PR2.

The operation of the bidirectional buffer in FIG. 7 will now be described with reference to the timing chart in FIG. 8.

Figure 8:
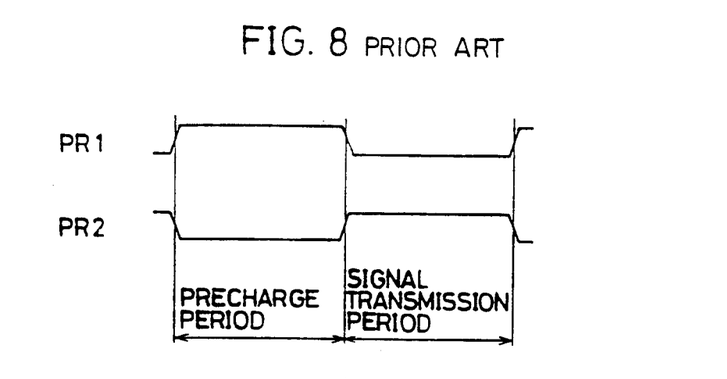
FIG. 8 is a timing chart for describing the operation of the bidirectional buffer of FIG. 7.

As shown in FIG. 8, the first precharge signal PR1 and the second precharge signal PR2 are (signals) complementary to each other. In the precharge period, the first precharge signal PR1 attains an H level and the second precharge signal PR2 attains an L level. The outputs of NOR gates 57 and 58 thereby attain an L level so that the first and the second discharge transistors 55 and 56 turn off. Also, the first and the second precharge transistors 53, 54 turn on. Accordingly, in the precharge period, the first and the second buses 51 and 52 are precharged to an H level by the supply potential.

In the signal transmission period, the first precharge signal PR1 attains an L level and the second precharge signal PR2 attains an H level. The first and the second precharge transistors 53 and 54 thereby turn off. At this time, the outputs of NOR gates 57 and 58 respectively change in response to the signal levels of the first and the second buses 51 and 52.

For example, when the signal of the first bus 51 attains an L level, the output of the first NOR gate 57 attains an H level. The second discharge transistor 56 thereby turns on so that the electric charge stored in the second bus 52 is discharged to the ground level through the second discharge transistor 56. Consequently, the potential of the second bus 52 attains an L level.

Conversely, when the signal of the second bus 52 attains an L level, the output of the second NOR gate 58 attains an H level. The first discharge transistor 55 thereby turns on so that the electric charge stored in the first bus 51 is discharged to the ground level through the first discharge transistor 55. The potential of the first bus 51 therefore attains an L level.

Thus, according to the bidirectional buffer in FIG. 7, the signal at an H level or at an L level supplied into the first bus 51 or the second bus 52 is transmitted to the second bus 52 or the first bus 51 as a signal at an H level or at an L level without inversion.

When the bidirectional buffer in FIG. 7 is used, the capacity of each bus that was split becomes small as the bus is split into a plurality of portions. Therefore, the time required to charge or discharge each bus is shortened.

According to the bidirectional buffer in FIG. 7, in the signal transmission period, a signal is usually transmitted bidirectionally between the first bus 51 and the second bus 52, Therefore, in the signal transmission period, it is impossible to electrically disconnect the first bus 51 and the second bus 52, and transmit a signal only in any one direction. Accordingly, in the case where a hierarchical bus is constituted using a plurality of buses and a plurality of bidirectional buffers, it is impossible to effect a parallel operation of the bus in which a signal is independently transmitted within each bus. It is also impossible to provide other buses with the result of an NOR operation and an AND operation related to the signals on a plurality of buses.

SUMMARY OF THE INVENTION

An object of the present invention is to make it possible to electrically disconnect a first bus and a second bus from each other and arbitrarily select the direction of signal transmission with a simplified circuit configuration.

Another object of the invention is to provide a signal transmission circuit in which a parallel operation of buses and a logical operation using buses can be effected when a hierarchical bus is constituted.

Still another object of the invention is to provide a signal transmission method which makes it possible to electrically disconnect a first bus and a second bus from each other, arbitrarily select the direction of signal transmission, and effect a parallel operation of buses and a logical operation using buses.

Yet another object of the invention is to make it possible to electrically disconnect a main bus from each sub bus, arbitrarily select the direction of signal transmission and effect a parallel operation of buses and a logical operation using buses in a hierarchical bus configuration.

The signal transmission circuit in accordance with the present invention, which is a signal transmission circuit for transmitting a signal bidirectionally between a first bus and a second bus, comprises a precharge circuit, a first transferring circuit, a second transferring circuit, a first enabling circuit and a second enabling circuit.

The precharge circuit precharges the first bus and the second bus to a predetermined potential, respectively. The first transferring circuit discharges the second bus or causes the potential of the second bus to be maintained in response to a signal on the first bus. The second transferring circuit discharges the first bus or causes the potential of the first bus to be maintained in response to a signal on the second bus. The first enabling circuit enables the first transferring circuit in response to a predetermined first enable signal. The second enabling circuit enables the second transferring circuit in response to a predetermined second enable signal.

The first bus and the second bus are precharged to a predetermined potential by the precharge means. When the first enabling circuit is provided with the first enable signal, the first transfer circuit is enabled. The signal is thereby transmitted from the first bus to the second bus. Also, when the second enable signal is supplied to the second enabling circuit, the second transfer circuit is enabled. A signal is hereby transmitted from the second bus to the first bus.

Therefore, when both of the first enable signal and the second enable signal are supplied, the signal is transmitted bidirectionally between the first bus and the second bus. When either one of the first enable signal and the second enable signal is supplied, a transmission of a signal is made in either one direction between the first bus and the second bus. When neither of the first enable signal and the second enable signal is supplied, the first and the second buses are electrically disconnected from each other.

Also, when constituting a hierarchical bus using the signal transmission circuit in accordance with the present invention, the parallel operation of the bus and the logical operation using the bus are made possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described in detail with reference to the drawings.

Figure 1:
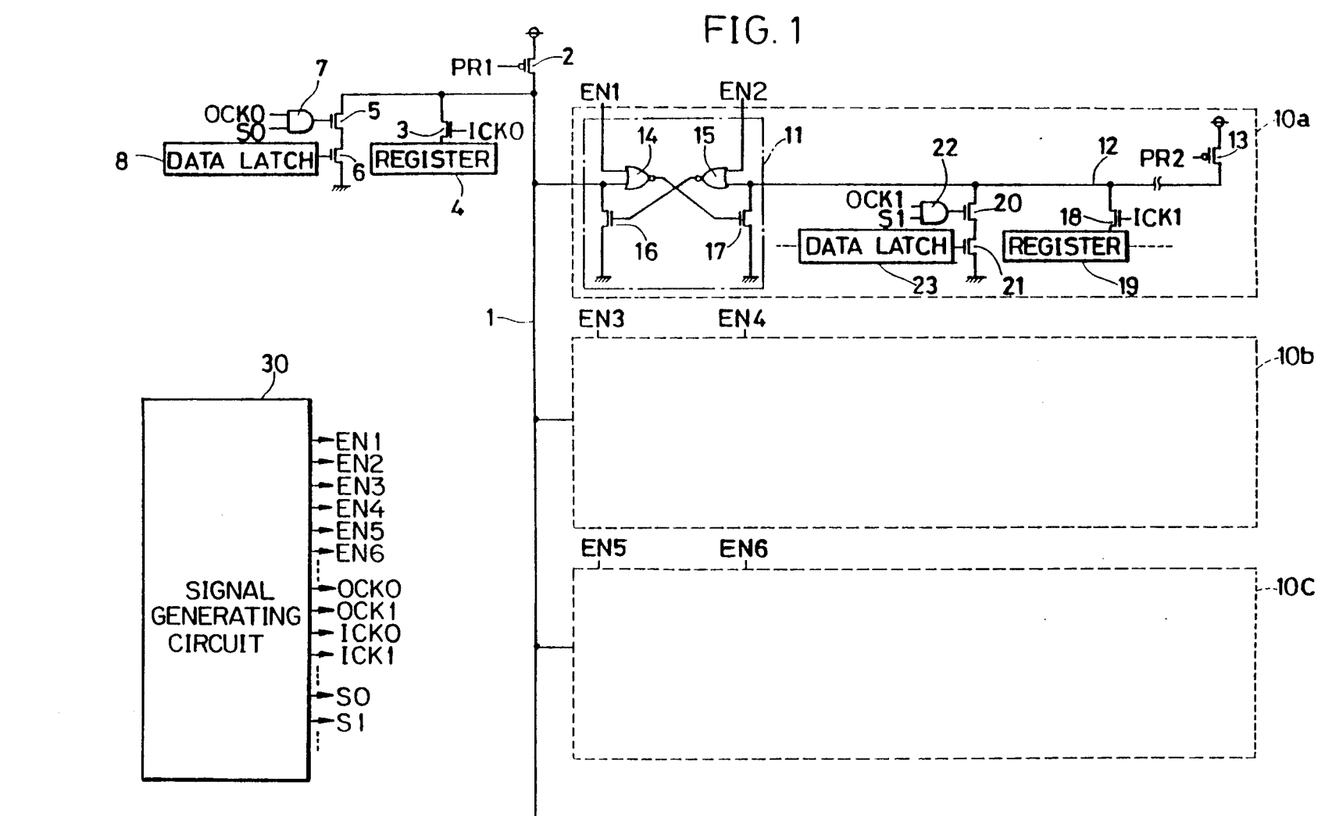
FIG. 1 is a circuit diagram showing a hierarchical bus configuration using a bidirectional buffer in accordance with one embodiment of the present invention.

FIG. 1 is a circuit diagram schematically showing a hierarchical bus configuration using a bidirectional signal transmission circuit in accordance with one embodiment of the present invention (hereinafter referred to as bidirectional buffer).

In FIG. 1, a plurality of sub bus units 10a, 10b, 10c are connected to a main bus 1. Sub bus units 10a, 10b, 10c respectively comprise a bidirectional buffer 11 and a sub bus 12.

Main bus 1 is coupled to the supply potential through a P channel type MOS transistor for precharge (hereinafter referred to as precharge transistor) 2. The gate of precharge transistor 2 is provided with a precharge signal PR1 from a signal generating circuit 30. A register 4 is connected to main bus 1 through an N channel type MOS transistor 3. The gate of transistor 3 is provided with an input clock signal ICK0 from signal generating circuit 30. Also, main bus 1 is coupled to the ground potential through N channel type MOS transistors 5 and 6. The gate of transistor 5 is provided with the output of a 2-input AND gate 7. One input terminal of AND gate 7 is provided with an output clock signal OCK0 from signal generating circuit 30, and the other input terminal is provided with a selection signal S0 from signal generating circuit 30. The gate of transistor 6 is provided with an output signal of a data latch 8.

A sub bus 12 within the sub bus unit 10a is connected to main bus 1 through the bidirectional buffer 11 in accordance with the present invention. Sub bus 12 is coupled to the supply potential through a P channel type MOS transistor (hereinafter referred to as precharge transistor) 13. The gate of precharge transistor 13 is provided with a precharge signal PR2 from signal generating circuit 30. A register 19 is connected to sub bus 12 through an N channel type MOS transistor 18. The gate of transistor 18 is provided with an input clock signal ICK1 from signal generating circuit 30. Also, sub bus 12 is coupled to the ground potential through N channel type MOS transistors 20 and 21. The gate of transistor 20 is provided with an output of a 2-input AND gate 22. One input terminal of AND gate 22 is provided with an output clock signal OCK1 from signal generating circuit 30, and the other input terminal is provided with a selection signal S1 from signal generating circuit 30. The gate of transistor 21 is provided with an output signal of a data latch 23.

Practically, while a plurality of logic circuits such as a plurality of registers and data latches etc. are connected to sub bus 12, one register 19 and one data latch 23 will only be shown in order to make the description simple.

Bidirectional buffer 11 comprises a first N channel type MOS transistor (hereinafter referred to as first discharge transistor) 16, a second N channel type MOS transistor (hereinafter referred to as second discharge transistor) 17, a first NOR gate 14 and a second NOR gate 15. One input terminal of the first NOR gate 14 is connected to main bus 1, and one input terminal of the second NOR gate 15 is connected to sub bus 12. The other input terminal of the first NOR gate 14 is provided with a first enable signal EN1 from signal generating circuit 30, and the other input terminal of the second NOR gate 15 is provided with a second enable signal EN2 from signal generating circuit 30.

The configurations of sub bus unit 10b and sub bus unit 10c are the same as that of sub bus unit 10a. However, the bidirectional buffer within sub bus unit 10b is provided with a third enable signal EN3 and a fourth enable signal EN4 from signal generating circuit 30, and the bidirectional buffer within sub bus unit 10c is provided with a fifth enable signal EN5 and a sixth enable signal EN6 from signal generating circuit 30.

Figure 2:
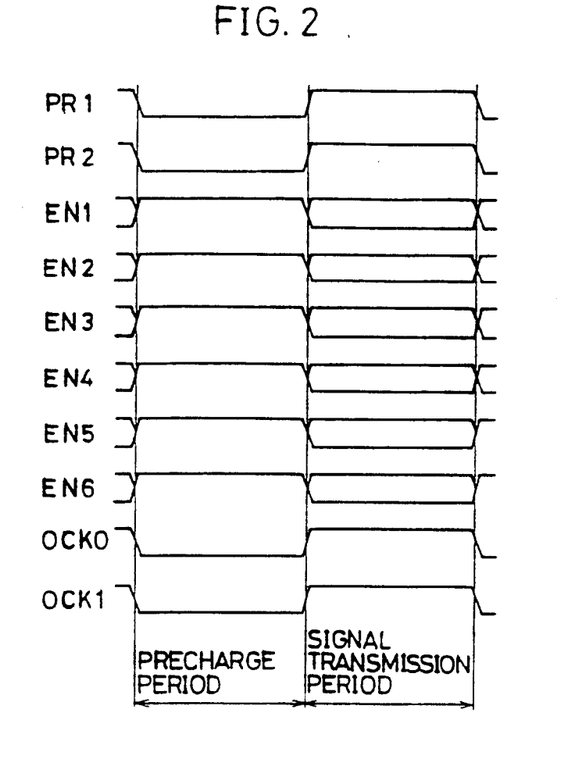
FIG. 2 is a timing chart for describing the operation of the bidirectional buffer of FIG. 1.

The operation of the bidirectional buffer of FIG. 1 will now be described with reference to the timing chart of FIG. 2.

In the precharge period, the first through the sixth enable signals EN1 through EN6 attain an H level. The outputs of the first and the second NOR gates 14 and 15 within each bidirectional buffer 11 thereby attain an L level so that the first and the second discharge transistors 16 and 17 turn off. Also, the output clock signals OCK0 and OCK1 attain an L level. The outputs of AND gates 7 and 22 thereby attain an L level so that transistors 5 and 20 turn off. Therefore, main bus 1 and sub bus 12 are electrically disconnected from the ground potential. Similarly, the sub buses within the sub bus units 10b, 10c are also electrically disconnected from the ground potential.

At this time, the first precharge signal PR1 and the second precharge signal PR2 attain an L level. Precharge transistors 2 and 13 thereby respectively turn on. Accordingly, main bus 1 and sub bus 12 are precharged to an H level respectively through precharge transistors 2 and 13. Similarly, the sub buses within sub bus units 10b, 10c are also precharged to an H level.

In the signal transmission period, the first precharge signal PR1 and the second precharge signal PR2 rise to an H level. Precharge transistors 2 and 13 thereby turn off so that main bus 1 and sub bus 12 are electrically disconnected from the supply potential. Similarly, the sub buses within sub bus units 10b, 10c are also electrically disconnected from the supply potential.

Figure 3:
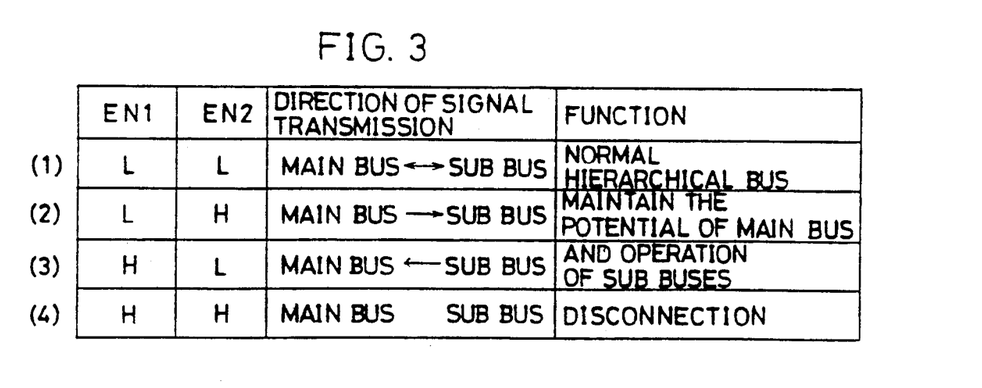
FIG. 3 is a diagram for describing the functions of the hierarchical bus of FIG. 1.

The respective operation of each sub bus and main bus 1 is similar to the operation described using FIG. 5. Four kinds of operation modes (1)-(4) of bidirectional buffer 11 will now be described referring to FIGS. 2 and 3.

(1) A First Operation Mode

In a first operation mode, a signal is transmitted bidirectionally between main bus 1 and each sub bus 12.

In this case, the first through the sixth enable signals EN1-EN6 attain an L level. The first and the second NOR gates 14 and 15 thereby function as inverters. Therefore, the second precharge transistor 17 turns off or on in accordance with the level of the signal of main bus so that the signal of main bus 1 at an H level or at an L level is transmitted to the sub bus as a signal at an H level or at an L level as it is. Also, the first discharge transistor 16 turns off or on in accordance with the level of the signal of sub bus 12. Accordingly, the signal of sub bus 12 at an H level or at an L level is transmitted, as it is, to main bus 1 as a signal at an H level or at an L level.

The transmission of a signal between the sub buses within sub bus units 10b, 10c and main bus 1 is also conducted in the same way.

Accordingly, in the first operation mode, a normal hierarchical bus is constituted in which all the potentials of main bus 1 and sub bus 12 attain an L level when any one potential of main bus 1 and a plurality of sub buses 12 attains an L level.

(2) A Second Operation Mode

In a second operation mode, a transmission of a signal is conducted in one direction from main bus 1 to each sub bus 12.

In this case, the first, the third and the fifth enable signals EN1, EN3, EN5 attain an L level, and the second, the fourth and the sixth enable signals EN2, EN4, EN6 attain an H level. The first NOR gate 14 thereby functions as an inverter.

For example, when the potential of main bus is at an H level, the output of the first NOR gate 14 attains an L level. The second discharge transistor 17 thereby turns off so that sub bus 12 is electrically disconnected from the ground potential. As the electric charge of sub bus 12 is not discharged, the potential is maintained at an H level.

Conversely, when the potential of main bus 1 is at an L level, the output of the first NOR gate 14 attains an H level. The second discharge transistor 17 hereby turns on so that the electric charge of sub bus 12 is discharged to the ground potential through the second discharge transistor 17. Accordingly, the potential of sub bus 12 attains an L level.

On the other hand, as the second precharge signal EN2 is at an H level, the output of the second NOR gate 15 attains an L level. The first discharge transistor 16 hereby turns off so that main bus 1 is electrically disconnected from the ground potential. Accordingly, the electric charge of main bus 1 is not discharged, and the potential is maintained.

The signal transmission between main bus 1 and each sub bus within sub bus units 10b, 10c is also conducted in the same way as the above description.

As stated above, while the signal of main bus 1 at an H level or at an L level is transmitted to sub bus 12 as a signal at an H level or at an L level as it is, conversely, the signal of sub bus 12 at an H level or at an L level is not transmitted to main bus 1. That is, in the second operation mode, a hierarchical bus is constituted in which a signal is transmitted in one direction from main bus 1 to sub bus 12.

(3) A Third Operation Mode

In a third operation mode, the first, the third and the fifth precharge signals EN1, EN3, EN5 attain an H level, and the second, the fourth and the sixth precharge signals EN2, EN4, EN6 attain an L level.

In this case, as the first enable signal EN1 is at an H level, the output of the first NOR gate 14 attains an L level. The second discharge transistor 17 hereby turns off so that sub bus 12 is electrically disconnected from the ground potential. Therefore, the electric charge of sub bus 12 is not discharged, and the potential level of sub bus 12 is maintained.

On the other hand, as the second enable signal EN2 is at an L level, the second NOR gate 15 functions as an inverter. For example, when the potential of sub bus 12 is at an H level, the output of the second NOR gate 15 attains an L level. The first discharge transistor 16 hereby turns off so that main bus 1 is electrically disconnected from the ground potential. As the electric charge of main bus 1 is not discharged, the potential is maintained at an H level.

Conversely, when the potential of sub bus 12 is at an L level, the output of the second NOR gate 15 attains an H level. The first discharge transistor 16 hereby turns on so that the electric charge of main bus 1 is discharged to the ground potential through the first discharge transistor 16. Therefore, the potential of main bus 1 attains an L level.

The signal transmission between each sub bus within sub bus units 10b, 10c and main bus 1 is also conducted in the same way as described above.

As stated above, while the signal of main bus 1 at an H level or at an L level is not transmitted to sub bus 12, the signal of sub bus 12 at an H level or at an L level is transmitted to main bus 1 as a signal at an H level or an L level.

That is, a signal is not transmitted from main bus 1 to sub bus 12, and sub bus 12 maintains its potential. On the other hand, at least one potential of sub bus attains an L level, and the potential of main bus 1 attains an L level. Therefore, in the third operation mode, a hierarchical bus is constituted in which the result of an AND operation processing as to a plurality of sub buses is transmitted to main bus 1.

(4) A Fourth Operation Mode

In a fourth operation mode, the first through the sixth enable signals EN1–EN6 attain an H level.

In this case, the outputs of the first and the second NOR gates 14 and 15 both attain an L level. Hereby, the first and second discharge transistors 16 and 17 both turn off so that main bus 1 and sub bus 12 are electrically disconnected from the ground potential.

Therefore, the signal of main bus 1 at an H level or at an L level is not transmitted to sub bus 12. The signal of sub bus 12 at an H level or at an L level is not transmitted to main bus 1, either. The signal transmission between main bus 1 and each bus within sub bus units 10b, 10c is not conducted, either.

As stated above, as all of main bus 1 and sub bus 12 are electrically disconnected from each other, the signal transmission between main bus 1 and sub bus 12 is not conducted. In this case, each of main bus 1 and sub bus 12 may independently transmit a signal within each bus. That is, a hierarchical bus is constituted in which all of main bus 1 and sub bus 12 may conduct a parallel operation independently of each other.

As described above, the first through the fourth operation modes are made possible by setting enable signals EN1–EN6. Moreover, it is also possible to set the sub buses within each circuit block to operation modes different from each other.

Figure 4:
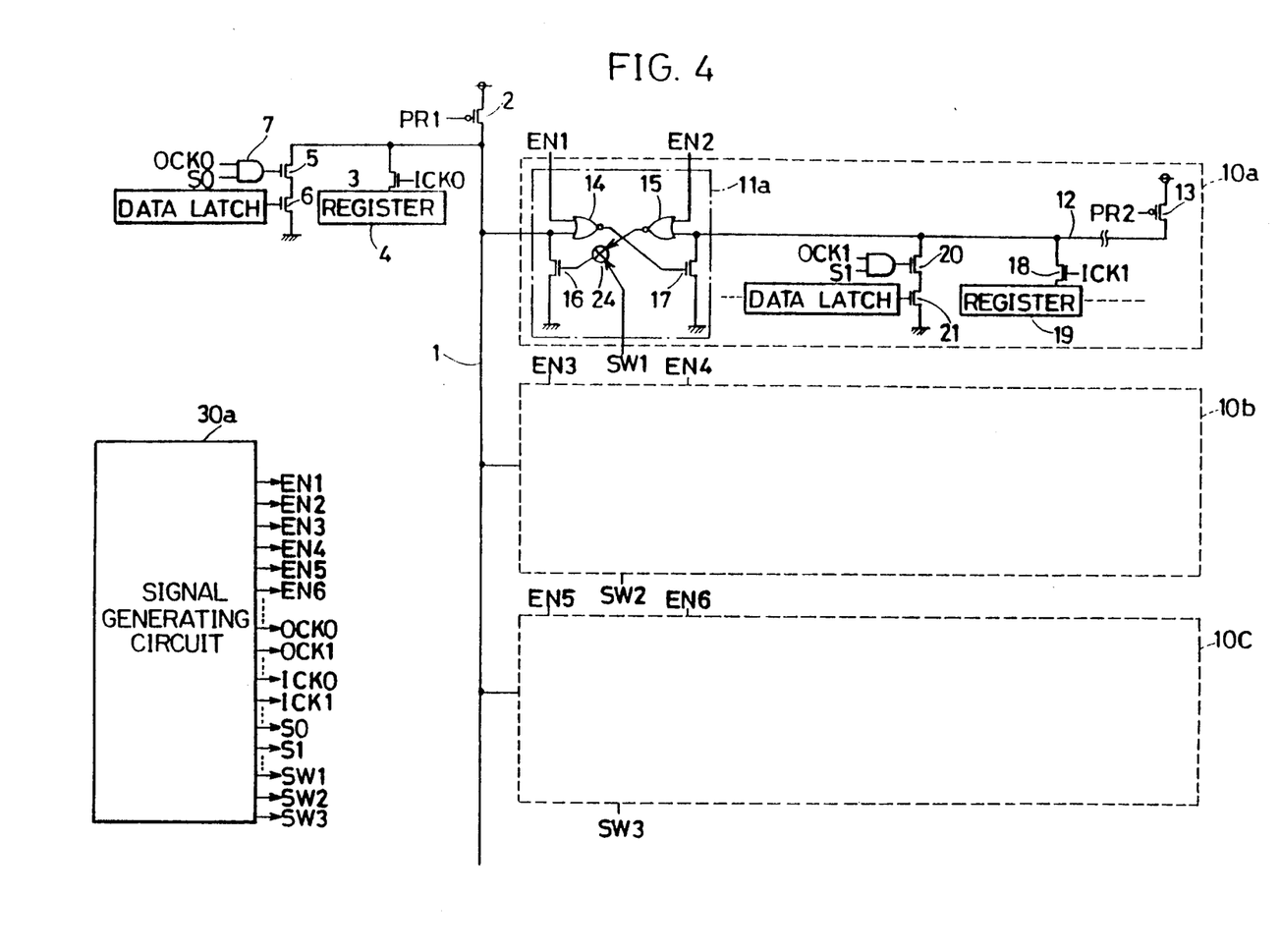
FIG. 4 is a circuit diagram showing an hierarchical bus configuration using a bidirectional buffer in accordance with other embodiment of the present invention.

FIG. 4 is a circuit diagram schematically showing a hierarchical bus configuration using a bidirectional buffer in accordance with other embodiment of the present invention.

An embodiment of FIG. 4 is different from that of FIG. 1 in that an exclusive OR gate 24 is connected between the second NOR gate 15 and the first discharge transistor 16. One input terminal of exclusive OR gate 24 is provided with the output of the first NOR gate 15, and the other input terminal is provided with a switching signal SW1 from signal generating circuit 30a. The exclusive OR gates of the bidirectional buffers within circuit blocks 10b, 10c are respectively provided with switching signals SW2, SW3 from signal generating circuit 30a.

The operation of the embodiment of FIG. 4 will now be described.

When the switching signals SW1, SW2, SW3 are at an L level, the hierarchical bus of FIG. 4 operates just in the same way as that of FIG. 1.

In the signal transmission period, when the switching signals SW1, SW2, SW3 are at an H level, the output of the second NOR gate 15 is inverted by exclusive OR gate 24. When the first, the third and the fifth enable signals EN1, EN3, EN5 are at an H level, and the second, the fourth and the sixth enable signals EN2, EN4, EN6 are at an L level, then the signal of sub bus 12 at an H level or at an L level is inverted and transmitted to main bus 1 as a signal at an L level or at an H level. The signal transmission from each sub bus within sub bus units 10b, 10c to main bus is also conducted in the same way.

Therefore, in the case above, if the potential of any one of sub buses 12 is at an H level, the potential of main bus 1 attains an L level. Thus, a hierarchical bus is constituted in which the result of an NOR operation with respect to a plurality of sub buses is transmitted to main bus 1.

As stated hereinbefore, in accordance with the embodiment above, the disconnection between main bus 1 and sub bus 12 and the selection of the transmission direction of the signals are made possible, and moreover, a hierarchical bus configuration may be accomplished in which a parallel operation of each sub bus 12 and an AND operation or an NOR operation using a bus of the precharge system are made possible.

As stated above, the disconnection between a first bus and a second bus is made possible by a simple circuit configuration and the selection of the transmission direction of the signals is also made possible. In addition, a hierarchical bus may be constituted, capable of a parallel operation of each bus and a logical operation using a bus of the precharge system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A hierarchical bus arrangement for performing parallel operations, including logical operations, comprising:
   a main bus;
   a plurality of sub buses;
   first precharge means for precharging said main bus to a predetermined potential;
   second precharge means for precharging each of said plurality of sub buses to a predetermined potential; and
   a plurality of signal transmission circuits each connected between said main bus and said plurality of sub buses, and each signal transmission circuit including:
   first transferring means responsive to a signal on said main bus for discharging a corresponding sub bus or for causing the potential of a corresponding sub bus to be maintained;
   second transferring means responsive to a signal on a corresponding sub bus for discharging said main bus or for causing the potential of said main bus to be maintained;
   first enabling means responsive to a predetermined first enable signal for enabling said first transferring means; and
   second enabling means responsive to a predetermined second enable signal for enabling said second transferring means, wherein
   said plurality of signal transmission circuits enable said hierarchical bus arrangement to perform said parallel and logical operations.

2. The hierarchical bus arrangement according to claim 1, wherein said first enabling means comprises:
   first gate means for applying a signal, responsive to a potential on said first bus, for enabling or disabling said first transferring means when said first enable signal is at a first level, and for applying a signal for disabling said first transferring means when said first enable signal is at a second level 1, and
   said second enabling means comprises:
   second gate means for applying a signal, responsive to a potential on said second bus, for enabling or disabling said second transferring means when said second enable signal is at a first level, and for applying a signal for disabling said second transferring means when said second enable signal is at a second level.

3. The hierarchical bus arrangement according to claim 1, wherein said first transferring means comprises first switching means coupled between said second bus and a predetermined potential and turning on or off in response to the potential on said first bus, and
   said second transferring means comprises second switching means coupled between said first bus and a predetermined potential and turning on or off in response to the potential on said second bus.

4. The hierarchical bus arrangement according to claim 2, wherein said first transferring means comprises first switching means coupled between said second bus and a predetermined potential and turning on or off in response to said signal responsive to the potential on said first bus when said first enable signal is at said first level, and turning off in response to said signal for disabling, and
   said second transferring means comprises second switching means coupled between said first bus and a predetermined potential and turning on or off in response to said signal responsive to the potential on said second bus when said second enable signal is at said first level, and turning off in response to said signal for disabling.

5. The hierarchical bus arrangement according to claim 4, wherein said first gate means comprises a first logic gate for applying a signal at a first logic level when said first enable signal is at said first level and the potential on said first bus is at a predetermined logic level, and for applying a signal at a second logic level in other cases,
   said second gate means comprises a second logic gate for applying a signal at a first logic level when said second enable signal is at said first level and the potential on said second bus is at a predetermined logic level, and for applying a signal at a second logic level in other cases,
   said first switching means comprises a first transistor coupled between said second bus and said predetermined potential and turning on in response to a signal at said first logic level supplied from said first logic gate and turning off in response to a signal at said second logic level supplied from said first logic gate, and
   said second switching means comprises a second transistor coupled between said first bus and said predetermined potential and turning on in response to a signal at said first logic level supplied from said second logic gate and turning off in response to a signal at said second logic level supplied from said second logic gate.

6. The hierarchical bus arrangement according to claim 1, wherein
said first precharge means comprises a first precharge transistor coupled between said first bus and said predetermined potential and turning on in response to a predetermined precharge signal; and
said second precharge means comprises a second precharge transistor coupled between said second bus and said predetermined potential and turning on in response to a predetermined precharge signal.

7. The hierarchical bus arrangement according to claim 1, further comprising:
logic gate means connected between said second transferring means and said second enabling means for supplying the output of said second enabling means to said second transferring means in response to a first level of a predetermined switching signal, and for supplying an inverted signal of the output of said second enabling means to said second transferring means in response to a second level of said switching signal.

8. The hierarchical bus arrangement according to claim 1, wherein said parallel and logical operations are performed in one bus cycle.

9. In a hierarchical bus arrangement including a plurality of signal transmission circuits enabling said hierarchical bus arrangement to perform parallel operations, including logical operations, a method for transmitting a signal bidirectionally between a first bus and a second bus with each signal transmission circuit, comprising the steps of:
precharging said first bus and said second bus respectively to a predetermined potential;
discharging said second bus or causing the potential of said second bus to be maintained in response to a signal on said first bus when a predetermined first enable signal is at an enable level;
preventing the signal transmission from said first bus to said second bus when said first enable signal is at a disable level;
discharging said first bus or causing the potential of said first bus to be maintained in response to the signal on said second bus when a predetermined second enable signal is at an enable level; and
preventing the signal transmission from said second bus to said first bus when said second enable signal is at a disable level.

10. The method according to claim 9, wherein said parallel and logical operations are performed in one bus cycle.

11. In a hierarchical bus arrangement for performing parallel operations, including logical operations, and including a main bus, a plurality of sub buses, first precharge means for precharging said main bus to a predetermined potential, second precharge means for precharging each of said plurality of sub buses to a predetermined potential, and a plurality of signal transmission circuits each connected between said main bus and said plurality of sub buses and having first transferring means responsive to a signal on said main bus for discharging a corresponding sub bus or for causing the potential of a corresponding sub bus to be maintained, second transferring means responsive to a signal on a corresponding sub bus for discharging said main bus or for causing the potential of said main bus to be maintained, first enabling means responsive to a predetermined first enable signal for enabling said first transferring means, and second enabling means responsive to a predetermined second enable signal for enabling said second transferring, a method of operating said hierarchical bus arrangement comprising the steps of:
transmitting a signal bidirectionally between said main bus and said plurality of sub buses in a first mode in response to a first combination of signal levels of said first and second enable signals;
transmitting a signal from said main bus to any of said plurality of sub buses in response to a second combination of signal levels of said first and second enable signals;
transmitting the result of a logical operation of signals of said plurality of sub buses to said main bus in response to a third combination of signal levels of said first and second enable signal; and
electrically disconnecting said main bus and said plurality of sub buses from each other in response to a fourth combination of signal levels of said first and second enable signals.

12. The method according to claim 11, wherein said parallel and logical operations are performed in one bus cycle.

13. A hierarchical bus arrangement comprising:
a first bus;
a plurality of second buses;
a plurality of signal transmission circuits enabling said hierarchical bus arrangement to perform parallel operations, including logical operations, each signal transmission circuit for transmitting a signal bidirectionally between said first bus and a respective second bus; and
precharge means for precharging said first bus and said plurality of second buses respectively to a predetermined potential;
each signal transmission circuit including
first transferring means responsive to a signal on said first bus for discharging said respective second bus or causing the potential of said respective second bus to be maintained,
second transferring means responsive to a signal on said respective second bus for discharging said first bus or causing the potential of said first bus to be maintained,
first enabling means responsive to a predetermined first enable signal for enabling operation of said first transferring means, and
second enabling means responsive to a predetermined second enable signal for enabling operation of said second transferring means, wherein said
first gate means comprises a first logic gate for applying a signal at a first logic level when said first enable signal is at said first level and the potential on said first bus is at a predetermined logic level, and for applying a signal at a second logic level in other cases;
said second gate means comprises a second logic gate for applying a signal at a first logic level when said second enable signal is at said first level and the potential on said respective second bus is at a predetermined logic level, and for applying a signal at a second logic level in other cases;
said first switching means comprises a first transistor coupled between said respective second bus and said predetermined potential and turning on in response to a signal at said first logic level supplied from said first logic gate and turning off in response to a signal at said second logic level supplied from said first logic gate; and said second switching means comprises a second transistor coupled between said first bus and said predetermined potential and turning on in response to a signal at said first logic level supplied from said second logic gate and turning off in response to a signal at said second logic level supplied from said second logic gate.

14. The hierarchical bus arrangement according to claim 13, wherein said parallel and logical operations are performed in one bus cycle.

15. A hierarchical bus arrangement comprising:

a first bus;

a plurality of second buses;

a plurality of signal transmission circuits enabling said hierarchical bus arrangement to perform parallel operations, including logical operations, each signal transmission circuit for transmitting a signal bidirectionally between said first bus and a respective second bus; and precharge means for precharging said first bus and said plurality of second buses respectively to a predetermined potential;

each signal transmission circuit including first transferring means responsive to a signal on said first bus for discharging said respective second bus or causing the potential of said respective second bus to be maintained, second transferring means responsive to a signal on said respective second bus for discharging said first bus or causing the potential of said first bus to be maintained, first enabling means responsive to a predetermined first enable signal for enabling operation of said first transferring means;

second enabling means responsive to a predetermined second enable signal for enabling operation of said second transferring means; and logic gate means connected to said second transferring means and said second enabling means for supplying the output of said second enabling means to said second transferring means in response to a first level of a predetermined switching signal, and for supplying an inverted signal of the output of said second enabling means to said second transferring means in response to a second level of said switching signal.

16. The hierarchical bus arrangement according to claim 15, wherein said parallel and logical operations are performed in one bus cycle.

* * * * *